US011130170B2

(12) United States Patent
Garay et al.

(10) Patent No.: US 11,130,170 B2
(45) Date of Patent: Sep. 28, 2021

(54) INTEGRATED CASTING CORE-SHELL STRUCTURE FOR MAKING CAST COMPONENT WITH NOVEL COOLING HOLE ARCHITECTURE

(71) Applicant: GENERAL ELECTRIC COMPANY, Schenectady, NY (US)

(72) Inventors: Gregory Terrence Garay, West Chester, OH (US); Meredith Dubelman, Liberty Township, OH (US); Xi Yang, Mason, OH (US); Tingfan Pang, West Chester, OH (US); Michael Scott Cole, Dayton, OH (US); Brian David Przeslawski, Liberty Township, OH (US); Douglas Gerard Konitzer, West Chester, OH (US); Nicole Barba, Cincinnati, OH (US); Kirk Gallier, Cincinnati, OH (US); Brian Keith, Cincinnati, OH (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 270 days.

(21) Appl. No.: 15/887,601

(22) Filed: Feb. 2, 2018

(65) Prior Publication Data

US 2019/0240726 A1    Aug. 8, 2019

(51) Int. Cl.
| | | |
|---|---|---|
| B22C 9/22 | (2006.01) | |
| B22D 29/00 | (2006.01) | |
| B28B 1/00 | (2006.01) | |
| B33Y 10/00 | (2015.01) | |
| F01D 5/18 | (2006.01) | |
| F01D 9/02 | (2006.01) | |

(Continued)

(52) U.S. Cl.
CPC ............. *B22C 9/22* (2013.01); *B22D 29/002* (2013.01); *B28B 1/001* (2013.01); *B33Y 10/00* (2014.12); *B33Y 80/00* (2014.12); *F01D 5/18* (2013.01); *F01D 9/02* (2013.01); *C30B 29/02* (2013.01); *F05D 2220/32* (2013.01); *F05D 2300/10* (2013.01)

(58) Field of Classification Search
CPC .... B22C 9/00; B22C 9/02; B22C 9/22; B22D 29/00; B22D 29/002
USPC .............. 164/516, 23, 28, 30, 361, 365, 369
See application file for complete search history.

(56) References Cited

U.S. PATENT DOCUMENTS

| | | | |
|---|---|---|---|
| 4,935,287 | A | 6/1990 | Johnson et al. |
| 5,256,340 | A | 10/1993 | Allison et al. |
| 5,296,308 | A | 3/1994 | Caccavale et al. |

(Continued)

FOREIGN PATENT DOCUMENTS

| | | |
|---|---|---|
| WO | WO03/009954 | 2/2003 |
| WO | WO2009/094905 A1 | 8/2009 |
| WO | WO 2010/045950 A1 | 4/2010 |

OTHER PUBLICATIONS

International Search Report Corresponding to Application No. PCT/US2018/037317 dated Sep. 11, 2018.

*Primary Examiner* — Kevin P Kerns
(74) *Attorney, Agent, or Firm* — Dority & Manning, P.A.

(57) ABSTRACT

Integrated core-shell investment casting molds that provide tongue or groove structures corresponding, respectively, to groove or tongue structures in the surface of the turbine blade or stator vane, including in locations that are otherwise inaccessible provide a pathway to restrict cooling flow between turbine blades to the flowpath.

7 Claims, 17 Drawing Sheets

(51) Int. Cl.
*B33Y 80/00* (2015.01)
*C30B 29/02* (2006.01)

(56) References Cited

U.S. PATENT DOCUMENTS

| | | | |
|---|---|---|---|
| 5,387,380 A | | 2/1995 | Cima et al. |
| 6,117,612 A | | 9/2000 | Halloran et al. |
| 6,193,922 B1 | * | 2/2001 | Ederer .................. B33Y 10/00 264/401 |
| 6,348,121 B1 | | 2/2002 | Schoener et al. |
| 7,448,433 B2 | | 11/2008 | Ortiz et al. |
| 8,851,151 B2 | | 10/2014 | Frasier et al. |
| 9,079,357 B2 | | 7/2015 | Ebert et al. |
| 9,109,451 B1 | | 8/2015 | Liang |
| 9,364,888 B2 | | 6/2016 | McBrien et al. |
| 9,375,782 B2 | | 6/2016 | McBrien et al. |
| 9,415,438 B2 | | 8/2016 | McBrien et al. |
| 9,482,103 B2 | | 11/2016 | McBrien et al. |
| 2003/0186042 A1 | * | 10/2003 | Dunlap et al. ........ B29C 70/745 428/304.4 |
| 2011/0310370 A1 | | 12/2011 | Rohner et al. |
| 2012/0248657 A1 | | 10/2012 | Ebert et al. |
| 2013/0309075 A1 | | 11/2013 | Brummitt-Brown et al. |
| 2017/0058686 A1 | | 3/2017 | Bancheri et al. |
| 2017/0113265 A1 | | 4/2017 | Slavens et al. |
| 2017/0159447 A1 | | 6/2017 | Clum et al. |
| 2017/0173671 A1 | | 6/2017 | Auxier et al. |

\* cited by examiner

INTEGRATED CASTING CORE-SHELL STRUCTURE FOR MAKING CAST COMPONENT WITH NOVEL COOLING HOLE ARCHITECTURE

INTRODUCTION

The present disclosure generally relates to investment casting mold components and processes utilizing these components. The mold made in accordance with the present invention includes integrated ceramic filaments between the core and shell of the mold that can be utilized to form holes, i.e., effusion cooling holes, in the cast component made from these molds as well as cast external features that were incapable of being cast due to limitations on conventional techniques involving wax.

BACKGROUND

Many modern engines and next generation turbine engines require components and parts having intricate and complex geometries, which require new types of materials and manufacturing techniques. Conventional techniques for manufacturing engine parts and components involve the laborious process of investment or lost-wax casting. One example of investment casting involves the manufacture of a typical rotor blade used in a gas turbine engine. A turbine blade typically includes hollow airfoils that have radial channels extending along the span of a blade having at least one or more inlets for receiving pressurized cooling air during operation in the engine. The various cooling passages in a blade typically include a serpentine channel disposed in the middle of the airfoil between the leading and trailing edges. The airfoil typically includes inlets extending through the blade for receiving pressurized cooling air, which include local features such as short turbulator ribs or pins for increasing the heat transfer between the heated sidewalls of the airfoil and the internal cooling air.

The manufacture of these turbine blades, typically from high strength, superalloy metal materials, involves numerous steps shown in FIG. 1. First, a precision ceramic core is manufactured to conform to the intricate cooling passages desired inside the turbine blade. A precision die or mold is also created which defines the precise 3-D external surface of the turbine blade including its airfoil, platform, and integral dovetail. A schematic view of such a mold structure is shown in FIG. 2. The ceramic core 200 is assembled inside two die halves which form a space or void therebetween that defines the resulting metal portions of the blade. Wax is injected into the assembled dies to fill the void and surround the ceramic core encapsulated therein. The two die halves are split apart and removed from the molded wax. The molded wax has the precise configuration of the desired blade and is then coated with a ceramic material to form a surrounding ceramic shell 202. Then, the wax is melted and removed from the shell 202 leaving a corresponding void or space 201 between the ceramic shell 202 and the internal ceramic core 200 and tip plenum 204. Molten superalloy metal is then poured into the shell to fill the void therein and again encapsulate the ceramic core 200 and tip plenum 204 contained in the shell 202. The molten metal is cooled and solidifies, and then the external shell 202 and internal core 200 and tip plenum 204 are suitably removed leaving behind the desired metallic turbine blade in which the internal cooling passages are found. In order to provide a pathway for removing ceramic core material via a leaching process, a ball chute 203 and tip pins 205 are provided, which upon leaching form a ball chute and tip holes within the turbine blade that must subsequently brazed shut.

The cast turbine blade may then undergo additional post-casting modifications, such as but not limited to drilling of suitable rows of film cooling holes through the sidewalls of the airfoil as desired for providing outlets for the internally channeled cooling air which then forms a protective cooling air film or blanket over the external surface of the airfoil during operation in the gas turbine engine. After the turbine blade is removed from the ceramic mold, the ball chute 203 of the ceramic core 200 forms a passageway that is later brazed shut to provide the desired pathway of air through the internal voids of the cast turbine blade. However, these post-casting modifications are limited and given the ever increasing complexity of turbine engines and the recognized efficiencies of certain cooling circuits inside turbine blades, more complicated and intricate internal geometries are required. While investment casting is capable of manufacturing these parts, positional precision and intricate internal geometries become more complex to manufacture using these conventional manufacturing processes. Accordingly, it is desired to provide an improved casting method for three dimensional components having intricate internal voids.

Methods for using 3-D printing to produce a ceramic core-shell mold are described in U.S. Pat. No. 8,851,151 assigned to Rolls-Royce Corporation. The methods for making the molds include powder bed ceramic processes such as disclosed U.S. Pat. No. 5,387,380 assigned to Massachusetts Institute of Technology, and selective laser activation (SLA) such as disclosed in U.S. Pat. No. 5,256,340 assigned to 3D Systems, Inc. The ceramic core-shell molds according to the '151 patent are limited by the printing resolution capabilities of these processes. As shown in FIG. 3, the core portion 301 and shell portion 302 of the integrated core-shell mold is held together via a series of tie structures 303 provided at the bottom edge of the mold. Cooling passages are proposed in the '151 patent that include staggered vertical cavities joined by short cylinders, the length of which is nearly the same as its diameter. A superalloy turbine blade is then formed in the core-shell mold using known techniques disclosed in the '151 patent, and incorporated herein by reference. After a turbine blade is cast in one of these core-shell molds, the mold is removed to reveal a cast superalloy turbine blade.

There remains a need to prepare ceramic core-shell molds produced using higher resolution methods that are capable of providing fine detail cast features in the end-product of the casting process.

SUMMARY

The following presents a simplified summary of one or more aspects of the present disclosure in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

In one aspect, the present disclosure is directed to a method for fabricating a ceramic mold, comprising: (a) contacting a cured portion of a workpiece with a liquid ceramic photopolymer; (b) irradiating a portion of the liquid ceramic photopolymer adjacent to the cured portion through a window contacting the liquid ceramic photopolymer; (c) removing the workpiece from the uncured liquid ceramic photopolymer; and (d) repeating steps (a)-(c) until a ceramic mold is formed, the ceramic mold comprising: (1) a core portion and a shell portion with at least one cavity between the core portion and the shell portion, the cavity adapted to define the shape of a cast component upon casting and removal of the ceramic mold, and (2) a plurality of inward protrusions protruding inward from the shell into the at least one cavity, wherein each inward protrusion defines a groove in the cast component upon removal of the mold. In some aspects, the method comprises, after step (d), a step (e) comprising pouring a liquid metal into a casting mold and solidifying the liquid metal to form the cast component. In some aspects, the method comprises, after step (e), a step (f) comprising removing the mold from the cast component. In some aspects, removing the mold from the cast component comprises a combination of mechanical force and chemical leaching. In some aspects, the cast component is adapted to fit with a second cast component by linking a groove in the cast component with a complementary tongue in the second cast component.

In another aspect, the present disclosure is directed to a first single crystal metal turbine blade or stator having one or more grooves and/or tongues on one or more surfaces of the first turbine blade or stator, the one or more grooves and/or tongues adapted to fit with one or more complementary tongues and/or grooves on an object. In some aspects, the object is a second turbine blade or stator. In some aspects, the grooves are seal slots adapted to contain seals to restrict cooling flow from the first turbine blade or stator to a second turbine blade or stator. In some aspects, the seal slots are located on a blade or stator platform or on a fore or aft skirt. In some aspects, the seal slots are located on a pressure side of the respective turbine blade or stator. In some aspects, the seal slots are located on a suction side of the respective turbine blade or stator. In some aspects, the turbine blade or stator has a platform with a first lateral end and a second lateral end opposed to the first lateral end, wherein the tongue is placed into the first lateral end and the groove is placed into the second lateral end.

These and other aspects of the invention will become more fully understood upon a review of the detailed description, which follows.

DETAILED DESCRIPTION

Figure 1:
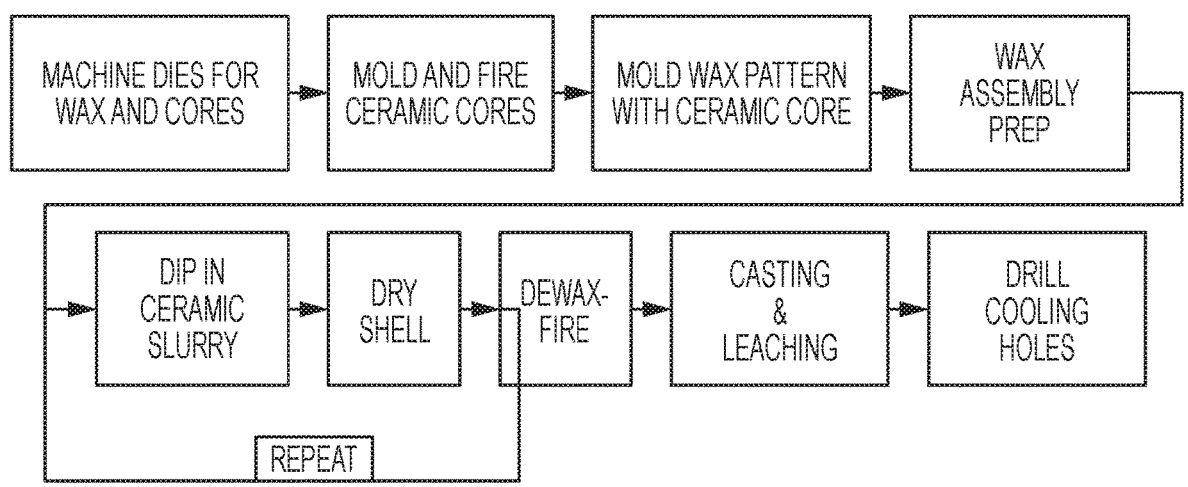
FIG. 1 is a flow diagram showing the steps for conventional investment casting.
Figure 2:
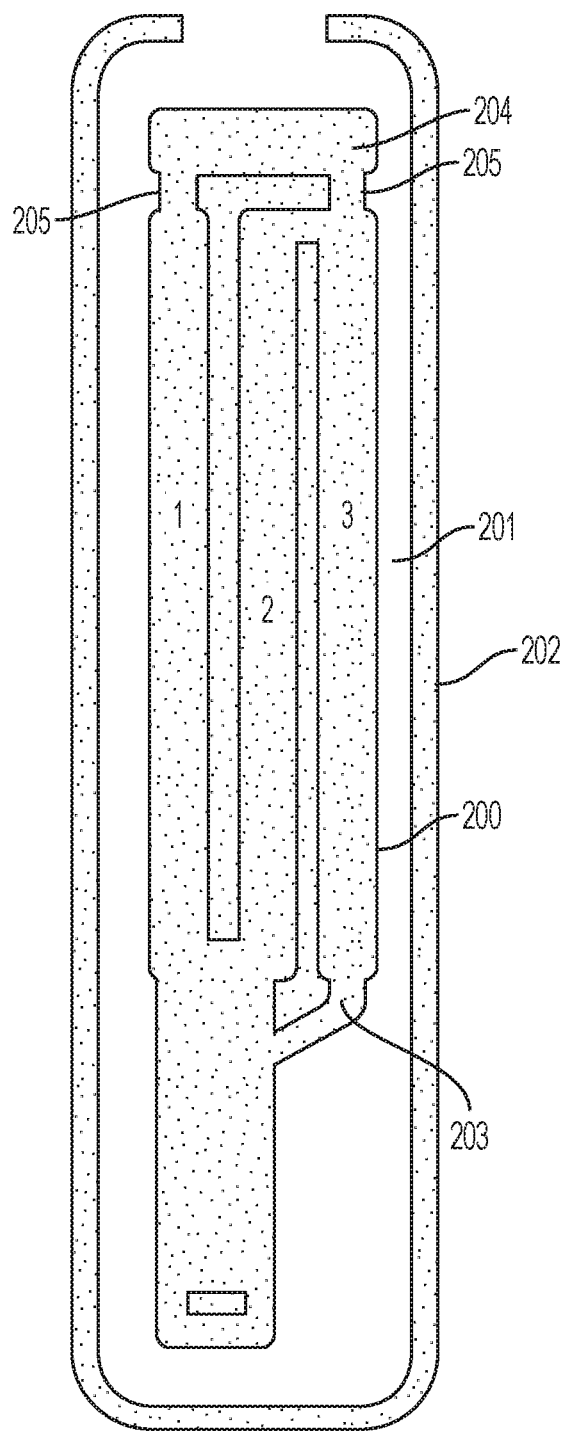
FIG. 2 is a schematic diagram showing an example of a conventional scheme for a core-shell mold with ball chute prepared by a conventional process.
Figure 3:
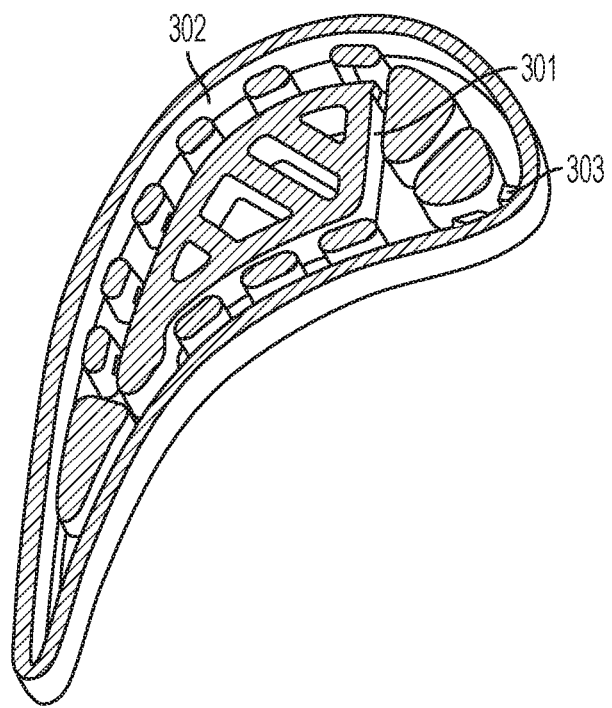
FIG. 3 shows a perspective view of a prior art integrated core-shell mold with ties connecting the core and shell portions.
Figure 4:
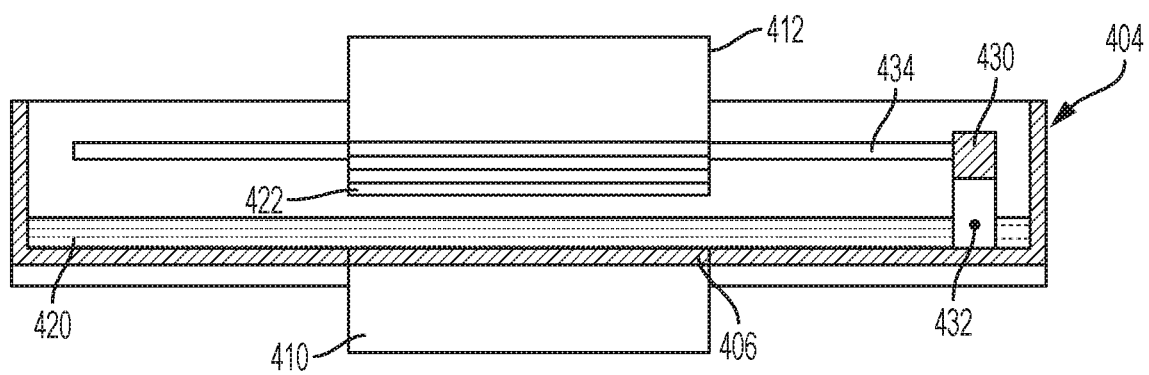
FIGS. 4, 5, 6 and 7 show schematic lateral sectional views of a device for carrying out successive phases of the method for direct light processing (DLP).
Figure 5:
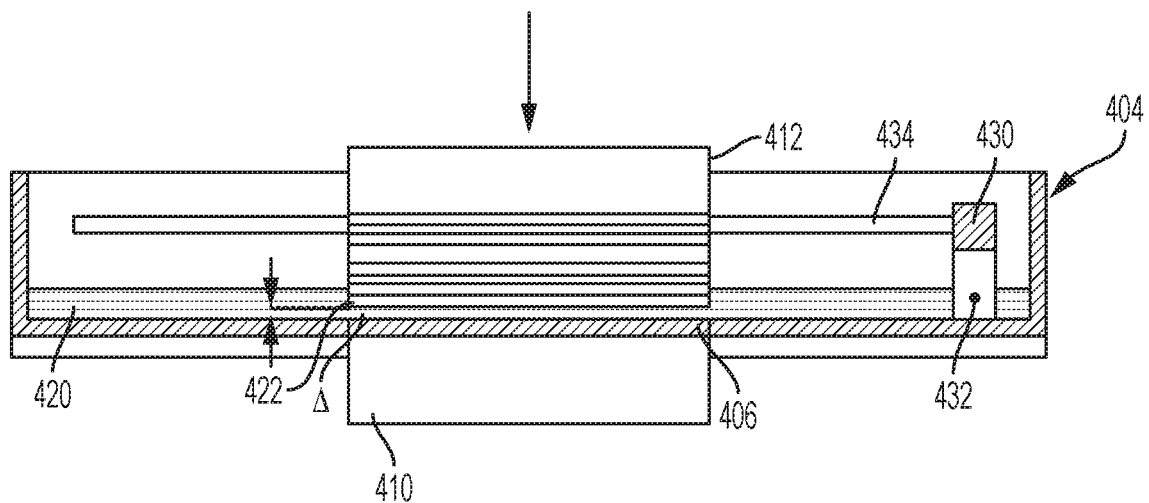

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. For example, the present invention provides a preferred method for making cast metal parts, and preferably those cast metal parts used in the manufacture of jet aircraft engines. Specifically, the production of single crystal, nickel-based superalloy cast parts such as combustors, turbine blades, vanes, and shroud components can be advantageously produced in accordance with this invention. However, other cast metal components may be prepared using the techniques and integrated ceramic molds of the present invention.

The present inventors recognized that prior processes known for making integrated core-shell molds lacked the fine resolution capability necessary to print filaments extending between the core and shell portion of the mold of sufficiently small size and quantity to result in effusion cooling holes in the finished turbine blade. In the case of earlier powder bed processes, such as disclosed in U.S. Pat. No. 5,387,380 assigned to Massachusetts Institute of Technology, the action of the powder bed recoater arm precludes formation of sufficiently fine filaments extending between the core and shell to provide an effusion cooling hole pattern in the cast part. Other known techniques such as selective laser activation (SLA) such as disclosed in U.S. Pat. No. 5,256,340 assigned to 3D Systems, Inc. that employ a top-down irradiation technique may be utilized in producing an integrated core-shell mold in accordance with the present invention. However, the available printing resolution of these systems significantly limit the ability to make filaments of sufficiently small size to serve as effective cooling holes in the cast final product. In particular, these prior processes and systems known for making integrated core-shell molds are unable to make cooling holes in a cast final product having one or more outer portions or overhangs, specifically in locations that are proximal to these outer portions or overhangs.

The present inventors have found that the integrated core-shell mold of the present invention can be manufactured using direct light processing (DLP). DLP differs from the above discussed powder bed and SLA processes in that the light curing of the polymer occurs through a window at the bottom of a resin tank that projects light upon a build platform that is raised as the process is conducted. With DLP an entire layer of cured polymer is produced simultaneously, and the need to scan a pattern using a laser is eliminated. Further, the polymerization occurs between the underlying window and the last cured layer of the object being built. The underlying window provides support allowing thin filaments of material to be produced without the need for a separate support structure. In other words, producing a thin filament of material bridging two portions of the build object is difficult and was typically avoided in the prior art. For example, the '151 patent discussed above in the background section of this application used vertical plate structures connected with short cylinders, the length of which was on the order of their diameter. Staggered vertical cavities are necessitated by the fact that the powder bed and SLA techniques disclosed in the '151 patent require vertically supported ceramic structures and the techniques are incapable of reliably producing filaments. In addition, the available resolution within a powder bed is on the order of ⅛" (3.2 mm), or 0.025 mm layer thickness for binder-jetting, making the production of traditional cooling holes impracticable. For example, round cooling holes generally have a diameter of less than 2 mm corresponding to a cooling hole area below 3.2 mm². Production of a hole of such dimensions requires a resolution far below the size of the actual hole given the need to produce the hole from several voxels. This resolution is simply not available in a powder bed process. Similarly, stereolithography is limited in its ability to produce such filaments due to lack of support and resolution problems associated with laser scattering. But the fact that DLP exposes the entire length of the filament and supports it between the window and the build plate enables producing sufficiently thin filaments spanning the entire length between the core and shell to form a ceramic object having the desired cooling hole pattern. Although powder bed and SLA may be used to produce filaments, their ability to produce sufficiently fine filaments as discussed above is limited.

One suitable DLP process is disclosed in U.S. Pat. No. 9,079,357 assigned to Ivoclar Vivadent AG and Technische Universitat Wien, as well as WO 2010/045950 A1 and US 2011/0310370, each of which are hereby incorporated by reference and discussed below with reference to FIGS. 4-7. The apparatus includes a tank 404 having at least one translucent bottom portion 406 covering at least a portion of the exposure unit 410. The exposure unit 410 comprises a light source and modulator with which the intensity can be adjusted position-selectively under the control of a control unit, in order to produce an exposure field on the tank bottom 406 with the geometry desired for the layer currently to be formed. As an alternative, a laser may be used in the exposure unit, the light beam of which successively scans the exposure field with the desired intensity pattern by means of a mobile mirror, which is controlled by a control unit.

Opposite the exposure unit 410, a production platform 412 is provided above the tank 404; it is supported by a lifting mechanism (not shown) so that it is held in a height-adjustable way over the tank bottom 406 in the region above the exposure unit 410. The production platform 412 may likewise be transparent or translucent in order that light can be shone in by a further exposure unit above the production platform in such a way that, at least when forming the first layer on the lower side of the production platform 412, it can also be exposed from above so that the layer cured first on the production platform adheres thereto with even greater reliability.

The tank 404 contains a filling of highly viscous photopolymerizable material 420. The material level of the filling is much higher than the thickness of the layers which are intended to be defined for position-selective exposure. In order to define a layer of photopolymerizable material, the following procedure is adopted. The production platform 412 is lowered by the lifting mechanism in a controlled way so that (before the first exposure step) its lower side is immersed in the filling of photopolymerizable material 420 and approaches the tank bottom 406 to such an extent that precisely the desired layer thickness Δ (see FIG. 5) remains between the lower side of the production platform 412 (or the last layer 422 printed thereon) and the tank bottom 406. During this immersion process, photopolymerizable material is displaced from the gap between the lower side of the production platform 412 and the tank bottom 406. After the layer thickness Δ has been set, the desired position-selective layer exposure is carried out for this layer, in order to cure it in the desired shape. Particularly when forming the first layer, exposure from above may also take place through the transparent or translucent production platform 412, so that reliable and complete curing takes place particularly in the contact region between the lower side of the production platform 412 and the photopolymerizable material, and therefore good adhesion of the first layer to the production platform 412 is ensured. After the layer has been formed, the production platform is raised again by means of the lifting mechanism.

These steps are subsequently repeated several times, the distance from the lower side of the layer 422 formed last to the tank bottom 406 respectively being set to the desired layer thickness Δ and the next layer thereupon being cured position-selectively in the desired way.

Figure 6:
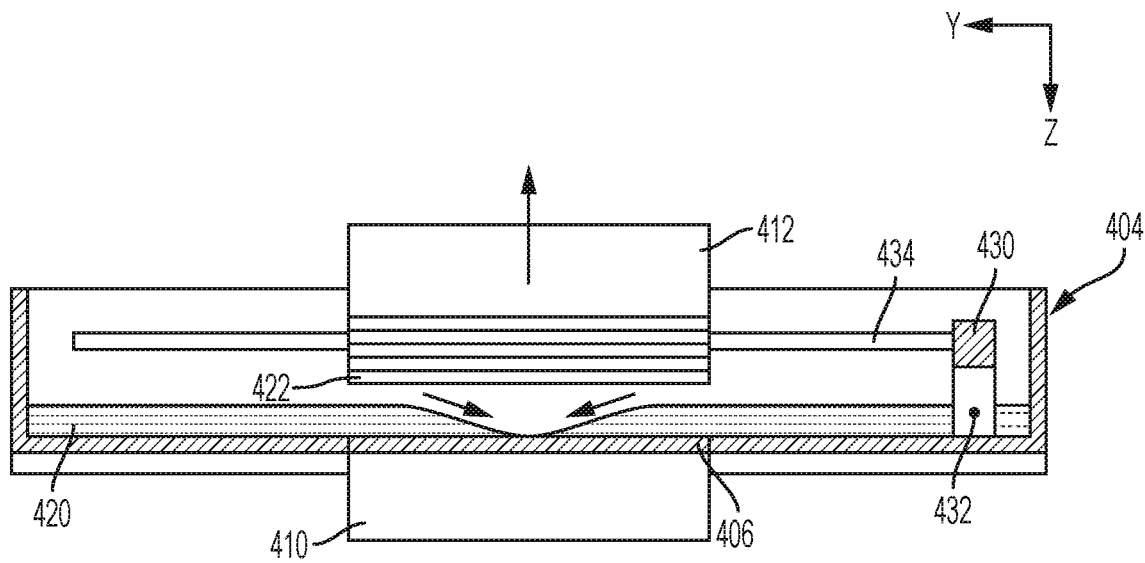

After the production platform 412 has been raised following an exposure step, there is a material deficit in the exposed region as indicated in FIG. 6. This is because after curing the layer set with the thickness Δ, the material of this layer is cured and raised with the production platform and the part of the shaped body already formed thereon. The photopolymerizable material therefore missing between the lower side of the already formed shaped body part and the tank bottom 406 must be filled from the filling of photopolymerizable material 420 from the region surrounding the exposed region. Owing to the high viscosity of the material, however, it does not flow by itself back into the exposed region between the lower side of the shaped body part and the tank bottom, so that material depressions or "holes" can remain here.

Figure 7:
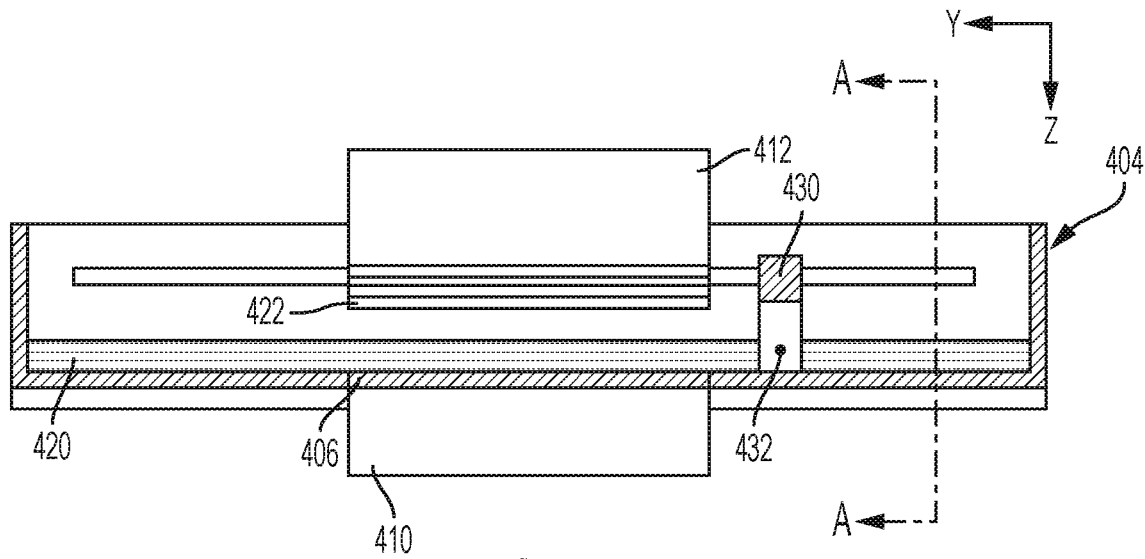

In order to replenish the exposure region with photopolymerizable material, an elongate mixing element 432 is moved through the filling of photopolymerizable material 420 in the tank. In the exemplary embodiment represented in FIGS. 4 to 8, the mixing element 432 comprises an elongate wire which is tensioned between two support arms 430 mounted movably on the side walls of the tank 404. The support arms 430 may be mounted movably in guide slots 434 in the side walls of the tank 404, so that the wire 432 tensioned between the support arms 430 can be moved relative to the tank 404, parallel to the tank bottom 406, by moving the support arms 430 in the guide slots 434. The elongate mixing element 432 has dimensions, and its movement is guided relative to the tank bottom, such that the upper edge of the elongate mixing element 432 remains below the material level of the filling of photopolymerizable material 420 in the tank outside the exposed region. As can be seen in the sectional view of FIG. 8, the mixing element 432 is below the material level in the tank over the entire length of the wire, and only the support arms 430 protrude beyond the material level in the tank. The effect of arranging the elongate mixing element below the material level in the tank 404 is not that the elongate mixing element 432 substantially moves material in front of it during its movement relative to the tank through the exposed region, but rather this material flows over the mixing element 432 while executing a slight upward movement. The movement of the mixing element 432 from the position shown in FIG. 6, to, for example, a new position in the positive y-direction, is shown in FIG. 7. It has been found that by this type of action on the photopolymerizable material in the tank, the material is effectively stimulated to flow back into the material-depleted exposed region between the production platform 412 and the exposure unit 410.

Figure 8:
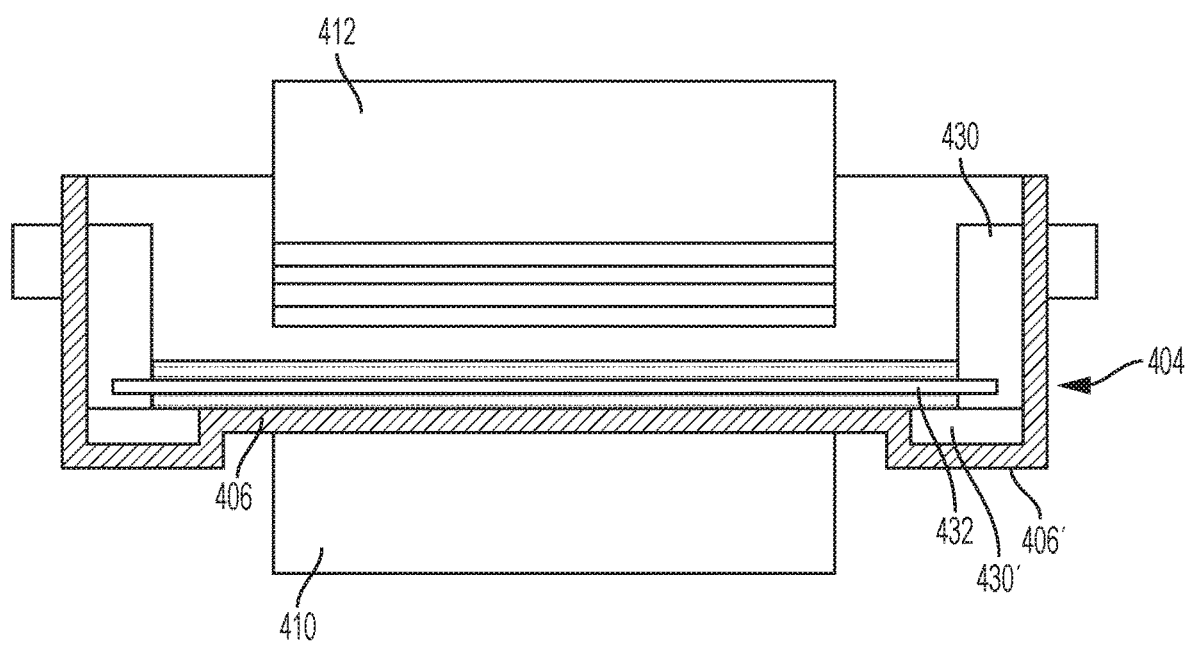
FIG. 8 shows a schematic sectional view along the line A-A of FIG. 7.

The movement of the elongate mixing element 432 relative to the tank may firstly, with a stationary tank 404, be carried out by a linear drive which moves the support arms 430 along the guide slots 434 in order to achieve the desired movement of the elongate mixing element 432 through the exposed region between the production platform 412 and the exposure unit 410. As shown in FIG. 8, the tank bottom 406' has recesses 406 on both sides. The support arms 430 project with their lower ends 430' into these recesses 406'. This makes it possible for the elongate mixing element 432 to be held at the height of the tank bottom 406, without interfering with the movement of the lower ends of the support arms 430 through the tank bottom 406.

Other alternative methods of DLP may be used to prepare the integrated core-shell molds of the present invention. For example, the tank may be positioned on a rotatable platform. When the workpiece is withdrawn from the viscous polymer between successive build steps, the tank may be rotated relative to the platform and light source to provide a fresh layer of viscous polymer in which to dip the build platform for building the successive layers.

Ceramic molds produced according to the present disclosure may contain at least one cavity between the core portion and the shell portion, the cavity adapted to define the shape of a cast component upon casting and removal of the ceramic mold, and a plurality of filaments joining the core and shell and defining a plurality of holes in the cast component defined by the core portion and an outer surface of the cast component upon removal of the mold. The cavity and filaments may be of any shape and size, depending on the desired shape of the cast component and any holes therein. The filaments and resulting holes may be linear or non-linear, and may be of any length, cross-sectional area, and/or diameter. In addition, the diameter and/or cross-sectional area of each of the plurality of filaments may change along its length. In some aspects, the cross-sectional area of each of the plurality of filaments ranges from 0.01 to 2 mm$^2$, or any subrange contained therein. In addition, the plurality of filaments may be arranged in any pattern on the outer surface of the cast component and on the core portion, so as to produce any desired pattern of cooling holes.

The length of the filament is dictated by the thickness of the cast component, e.g., turbine blade or stator vane wall thickness, and the angle at which the cooling hole is disposed relative to the surface of the cast component. In some aspects, the filament lengths range from 0.5 to 5 mm, such as between 0.7 to 1 mm, such as about 0.9 mm. A cooling hole may be disposed at any angle relative to the surface of the cast component. In some aspects, the angle at which a cooling hole is disposed is at an angle other than 90° from the surface, such as approximately 5 to 35° relative to the surface, such as less than 20°, such as between 10 to 20°, such as approximately 12°, or such as 5° to 15°. It should be appreciated that the methods of casting according to the present invention allow for formation of cooling holes having a lower angle relative to the surface of the cast component than currently available using conventional machining techniques.

The specific shape of a cooling hole made in accordance with the present invention is determined by the shape of the filament connecting the core to the shell portion of the mold. Because the process for making filaments allows complete control over the dimensions of the filament, the present invention can be used to make any shape cooling hole. Moreover, a single cast object may be provided with several kinds of cooling hole designs. The following describes several non-limiting examples for cooling hole designs that may be used in accordance with the present invention. One key characteristic of the cooling holes of the present invention is that they may be provided with a non-line-of-sight shape. In practice, cooling holes drilled through a completed turbine blade using electro discharge machining (EDM) were limited to cooling holes that were generally shaped to have a line of sight through the cast metal object. This is because the EDM apparatus has a generally linear shape and operates by drilling through outer surface of the cast object to reach the core cavity. It is generally not possible to drill from the core cavity side of the cast object because the core cavity is inaccessible. In some aspects of the present disclosure, the filaments or holes are non-linear.

The present invention relates also to methods of making cast metal objects, in particular single crystal turbine blades and stators used in jet aircraft engines that have non-linear cooling holes such as the exemplary design shown in U.S. patent application Ser. No. 15/377,787, titled "INTEGRATED CASTING CORE SHELL STRUCTURE FOR MAKING CAST COMPONENT WITH NON-LINEAR HOLES" with attorney docket number 037216.00041/285064, and filed Dec. 13, 2016 ("the '787 application"), which is incorporated by reference herein in its entirety. The method begins with the production of the ceramic mold using DLP. The DLP process involves a repetition of steps of (a) contacting a cured portion of a workpiece with a liquid ceramic photopolymer; (b) irradiating a portion of the liquid ceramic photopolymer adjacent to the cured portion through a window contacting the liquid ceramic photopolymer; and (c) removing the workpiece from the uncured liquid ceramic photopolymer. The steps (a)-(c) are repeated until the ceramic mold is formed. After the mold is formed, liquid metal may then be poured into the casting mold and solidified to form the cast component. The ceramic mold is then removed from the cast component using, for example, combination of mechanical removal of the outer shell and leaching of the inner ceramic core.

The specific geometry of the non-linear cooling hole filaments may be varied based on the needs for specific effusion cooling hole pattern to be placed in the turbine blade or stator. For example, the direction of the hole may be opposite that shown in the '787 application with holes aligned toward the top of the turbine blade. The filament may have a curvature that forms an "S" shaped hole upon removal of the mold. Alternatively, the holes may be aligned horizontally along the turbine blade such that they project inward or alternatively outward of the page. Given the flexibility possible for DLP processing, there are no limitations on the shape of the cooling hole. A few alternative exemplary cooling hole geometries are shown in the '787 application.

After leaching, the resulting holes in the turbine blade from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step. After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade, the molten metal is preferably a superalloy metal that formed into a single crystal superalloy turbine blade using techniques known to be used with conventional investment casting molds.

Figure 9A:
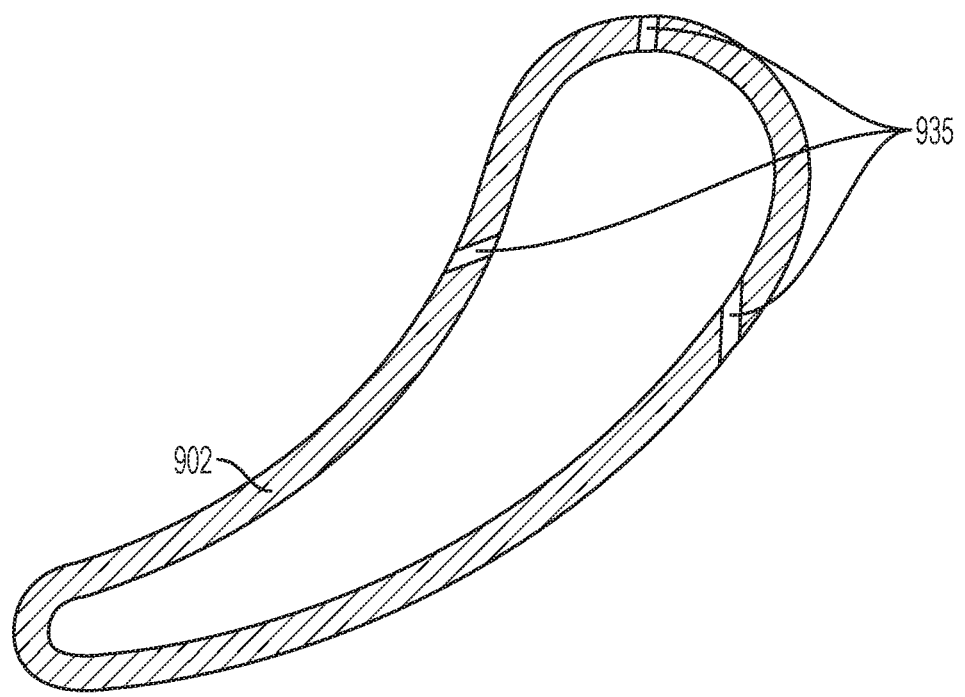
FIGS. 9A-9E show schematic cross-sectional views of cast metal components prepared by some aspects of the present disclosure.
Figure 9B:
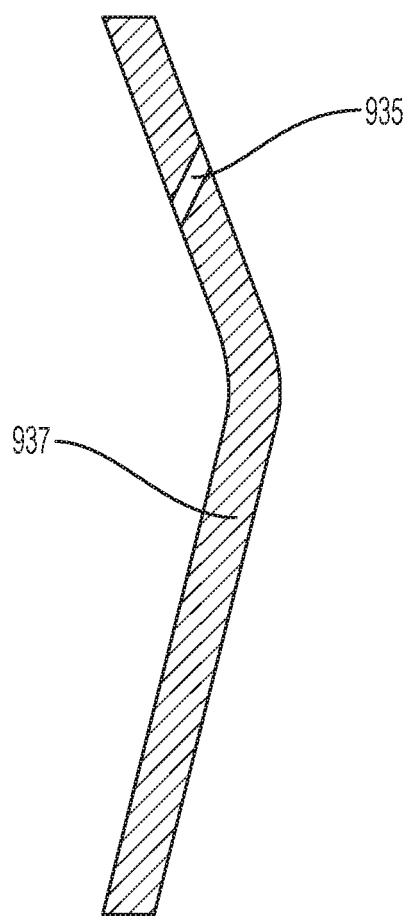
Figure 9C:
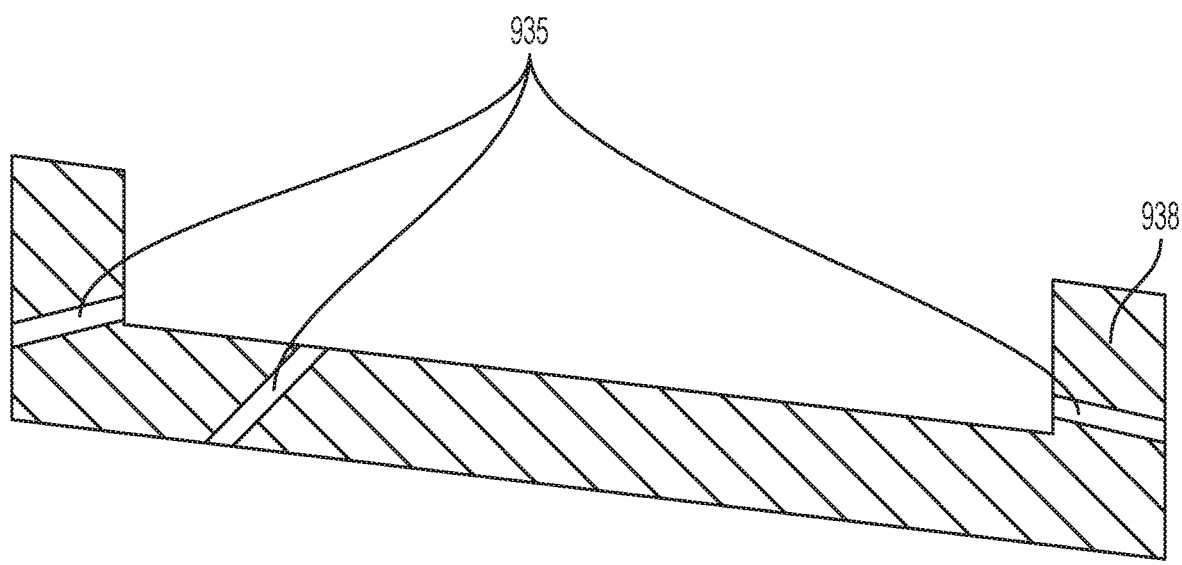
Figure 9D:
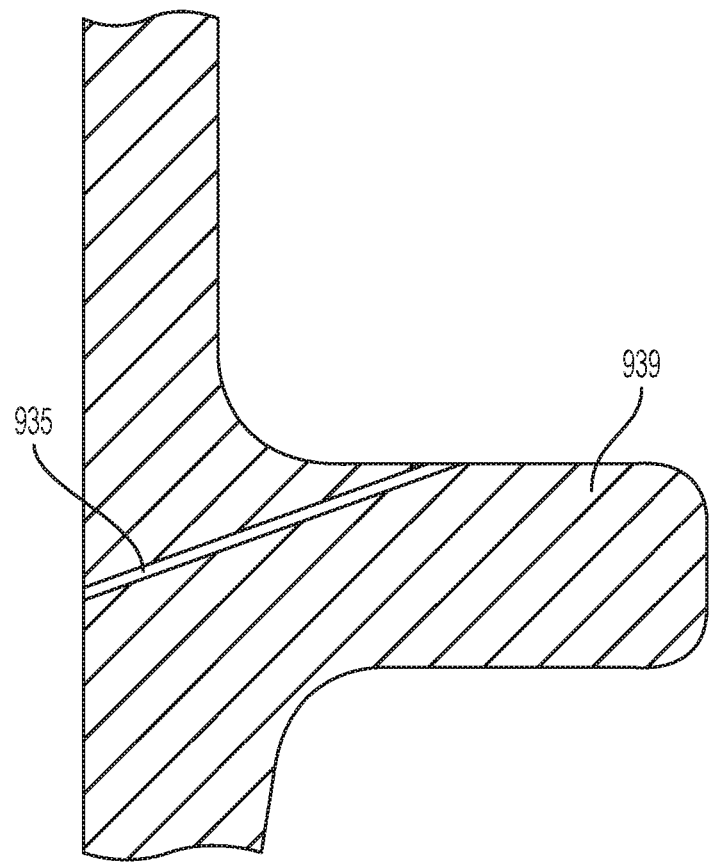
Figure 9E:
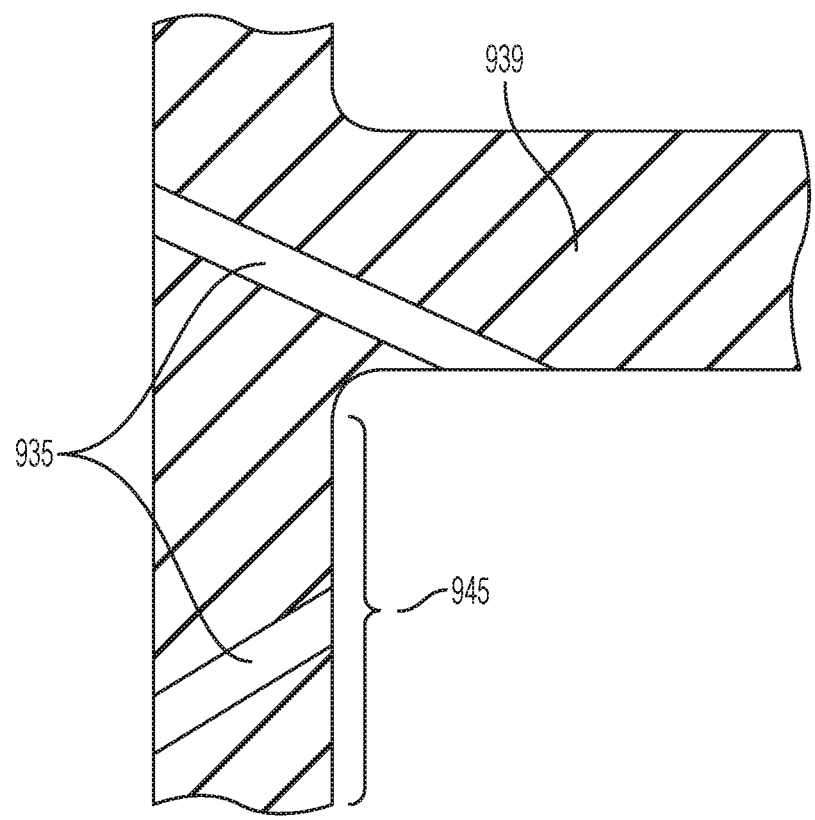

The methods of the present disclosure may be used to produce objects of any shape or size, including various components for use in turbine engines. FIG. 9A shows an example of such an object, e.g., a gas turbine airfoil 902. According to some aspects of the present disclosure, the airfoil 902 may be cast with one or more cooling holes 935 connecting the interior cavity of the turbine blade to its external surface. FIG. 9B shows a schematic cross-section of a gas turbine band 937 that may be produced, with one or more holes 935 cast within. Similarly, gas turbine shroud 938 may be produced with one or more cast-in holes 935 within, as shown in FIG. 9C. FIG. 9D shows a schematic cross-section of a gas turbine blade platform 939 containing a cast-in cooling hole 935. FIG. 9E shows a schematic cross-section of a gas turbine blade platform 939 and blade shank 945 each containing a cast-in cooling hole 935. The cooling hole toward the bottom in FIG. 9E cannot be produced using conventional drilling techniques due to the blade platform 939 blocking the line of sight needed to drill a hole in the blade shank 945. The one or more cooling holes 935 in FIGS. 9A-9E are formed from ceramic filaments in the respective ceramic molds, specifically, ceramic filaments connecting the ceramic core used to prepare the void within the respective component to the ceramic shell surrounding the cavity.

In some aspects, the cavity is shaped so as to define a secondary surface of the cast component contained beneath the outer surface of the cast component. In such aspects, the core of the core-shell mold contains an inner core (beneath the secondary surface) and an outer core (between the secondary and outer surfaces). In other aspects, the core is a single core. In some aspects, a plurality of filaments may join the inner core and the outer core and define a plurality of holes in the cast component defined in the inner core and the secondary surface upon removal of the mold. The plurality of filaments or holes in the secondary surface may be similar in some aspects to the plurality of filaments in the outer surface.

Figure 10:
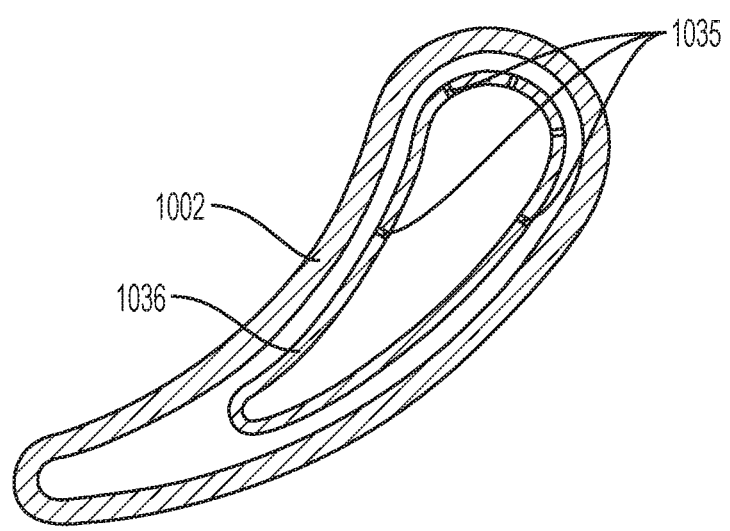
FIG. 10 shows a schematic cross-sectional view of a cast metal component containing a secondary surface prepared by some aspects of the present disclosure.

FIG. 10 shows a schematic cross-section of a gas turbine airfoil 1002 containing a baffle 1036. Airfoil 1002 may be similar in some aspects to airfoil 902. Baffle 1036 as shown contains a plurality of holes 1035, which may be similar in some aspects to the plurality of holes 935. As described above the plurality of holes 1035 are formed from ceramic filaments connecting the ceramic core used to prepare the void within the baffle 1036 to the intermediate void between the baffle 1036 and the airfoil 1002.

Figure 11A:
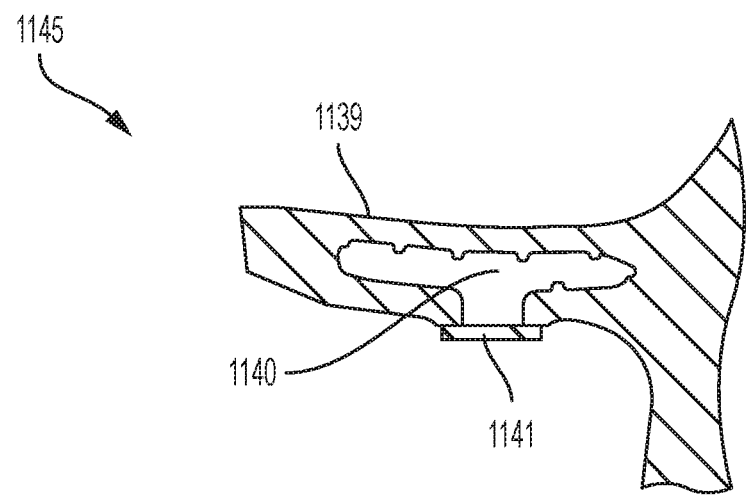
FIGS. 11A and 11B show schematic cross-sectional views of cast metal components containing reservoirs prepared by some aspects of the present disclosure.
Figure 11B:
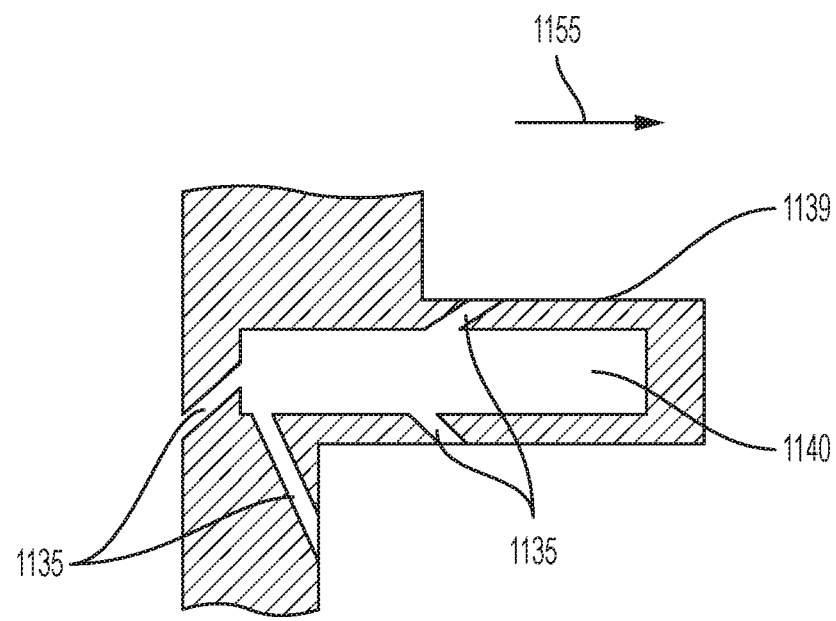

In addition, the core (whether a single core or an inner core and an outer core) may be of any size or of any size relative to the thickness of the cast metal component. In some aspects, the core thickness is larger than the cast metal component thickness, and upon removal of the ceramic mold the larger thickness core creates a reservoir within the cast metal component. The reservoir may be of any size or shape and may contain one or more holes connecting it to the outer surface of the part. FIG. 11A shows an example cross-section of a gas-turbine blade 1145 with reservoir 1140 within the blade platform 1139. Without wishing to be bound to any particular theory, the reservoir 1140 may cool air within it to help regulate blade temperature during operation. The reservoir 1140 may be sealed using an optional access plate 1141. In other aspects, one or more cooling holes 1135 may connect reservoir 1140 to the outer surface of the blade, e.g., to the flowpath 1155 of the turbine engine (FIG. 11B). The one or more cooling holes 1135 may be similar in some aspects to the one or more holes 935.

Figure 11C:
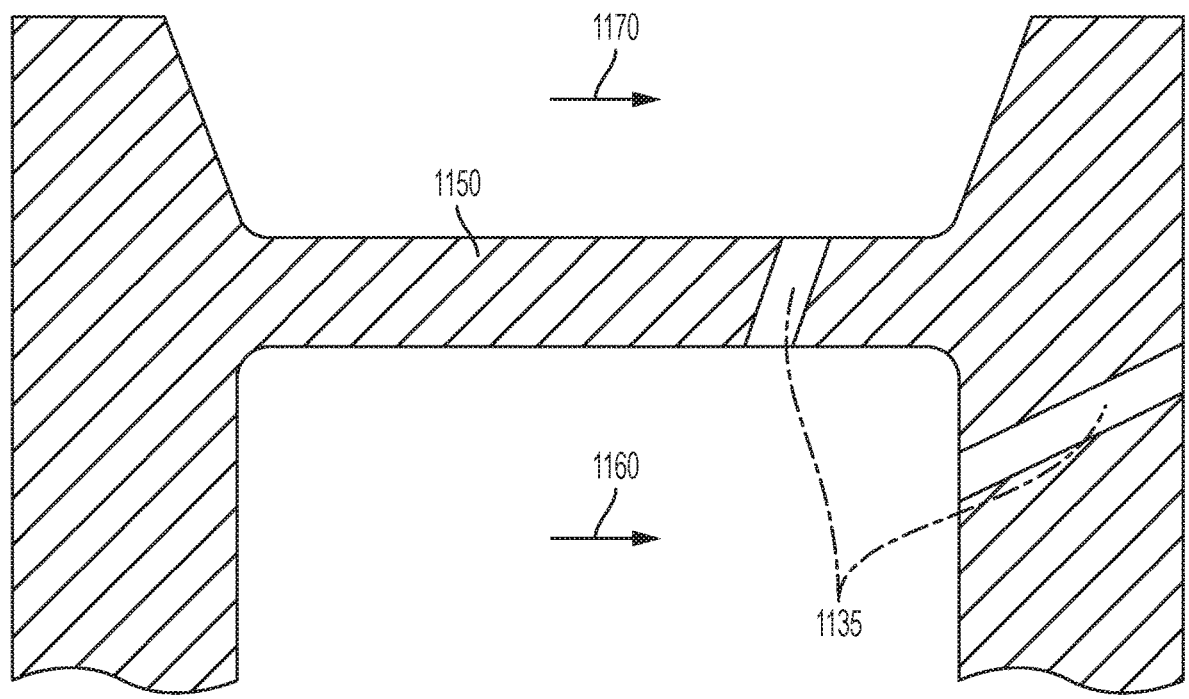
FIG. 11C shows a schematic cross-sectional view of a cast metal gas turbine blade tip containing a blade tip cooling circuit.

FIG. 11C shows a schematic cross-section of a gas turbine blade tip 1150 containing one or more holes 1135, which may be similar in some aspects to the one or more holes 935, connecting the blade internal cooling circuit 1160 to the plenum 1170. The blade internal cooling circuit 1160 may be similar in some aspects to reservoir 1140. As described above, the one or more cooling holes 1135 are formed from ceramic filaments connecting the ceramic core used to prepare reservoir 1140 to the ceramic shell surrounding the cavity, or connecting the ceramic core used to prepare blade internal cooling circuit 1160 to the ceramic shell surrounding the cavity.

Figure 12A:
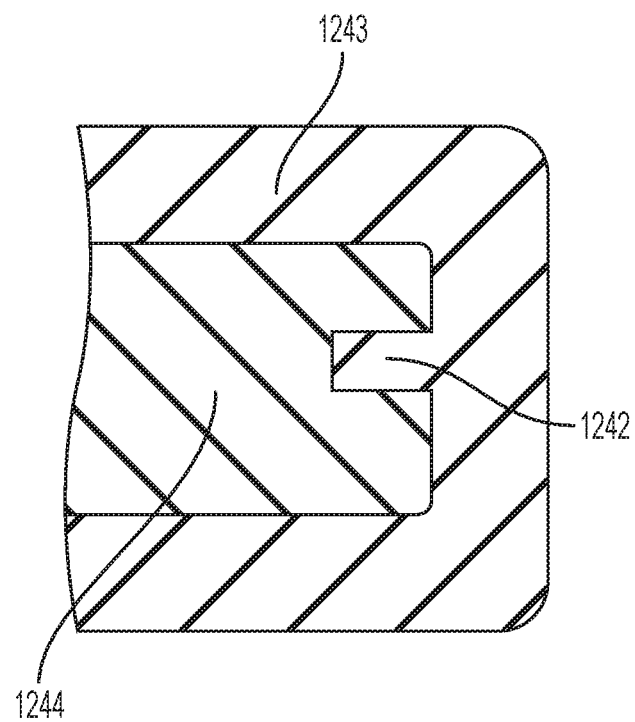
FIG. 12A shows a two-dimensional schematic cross-sectional view of a cast metal component containing a cast groove prepared according to an embodiment of the invention.
Figure 12B:
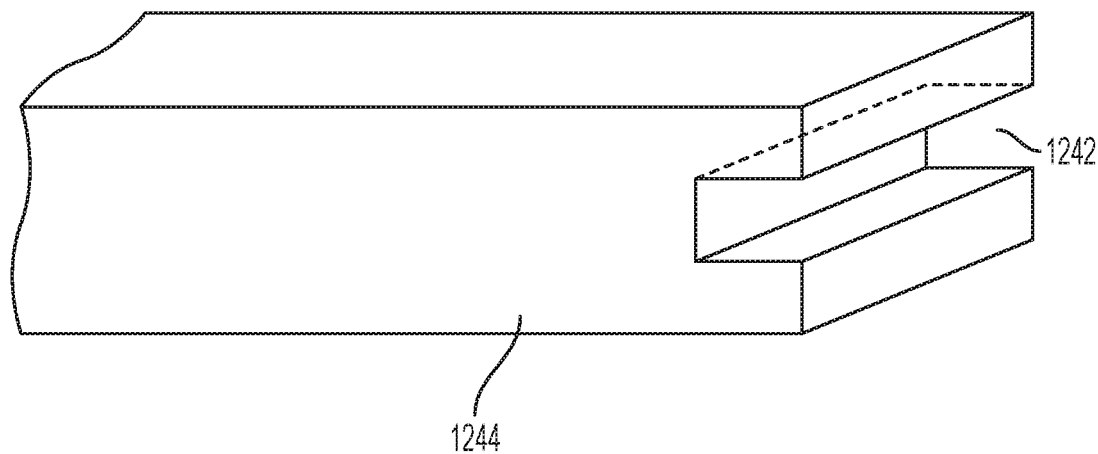
FIG. 12B shows a perspective view of the cast metal component shown in FIG. 12A with the shell removed.
Figure 12C:
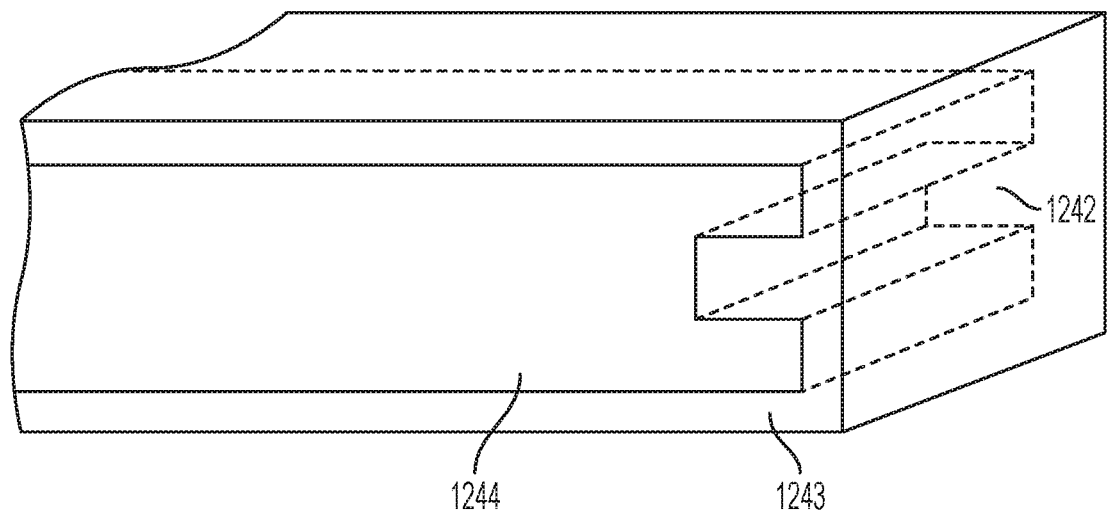
FIG. 12C shows the same perspective view as shown in FIG. 12B with the shell included.

In other aspects, the ceramic mold may contain one or more incomplete filaments, i.e., inward protrusions from the shell into the cavity that do not join a ceramic core. Upon casting of the cast metal component and removal of the ceramic mold, each of the one or more inward protrusions may define a respective groove in the cast metal component. FIGS. 12A-C show an example of a cast metal part 1244 containing a groove defined by inward protrusion 1242 from ceramic mold 1243. In other aspects, the ceramic mold itself may contain one or more grooves therein, each defining an outward protrusion or tongue from the cast metal component upon removal of the ceramic mold. In some aspects, the cast component may contain one or more tongues and one or more grooves. In some aspects, the cast component may contain a plurality of grooves (each defined by a plurality of inward protrusions in the ceramic mold, protruding inward from the shell into the at least one cavity) and a plurality of tongues (each defined by a groove in the ceramic mold shell), wherein each tongue in the cast component is opposite a groove in the cast component.

Figure 13A:
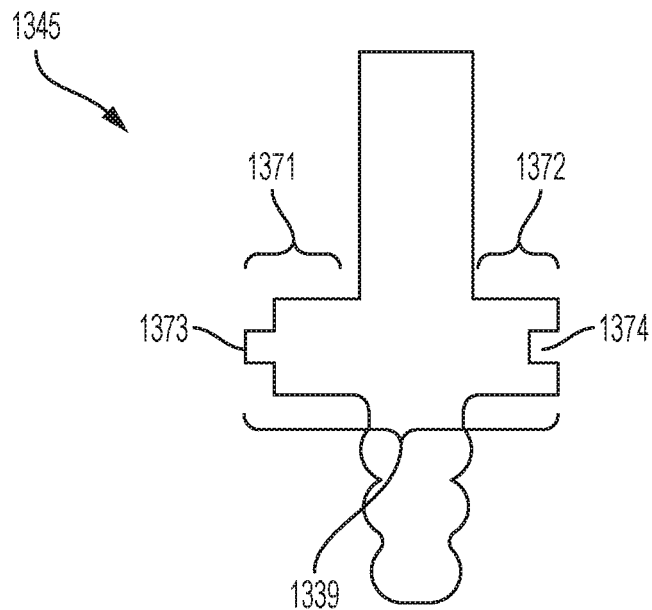
FIG. 13A shows a single cast turbine blade with tongue and groove features on the blade platform.
Figure 13B:
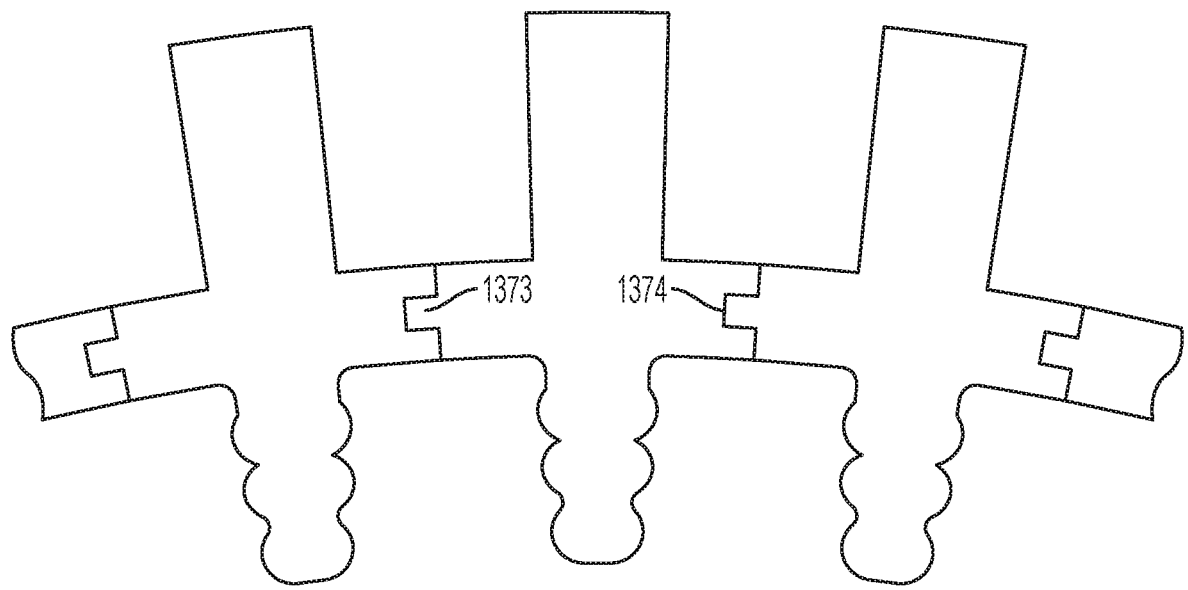
FIG. 13B shows a schematic cross-sectional view of several cast turbine blades with interlocking tongue and groove features on adjacent blade platforms.

The groove or tongue from the cast metal component may be of any size and/or shape relative to the cast metal component. In some aspects, the inward protrusion 1242 has at least one dimension with a cross-section that is less than the corresponding dimension in the cast metal component 1244. In some aspects, the groove or tongue from the cast metal component may be adapted to fit with a complementary tongue or groove, respectively, in another component. As used herein, a tongue or groove in a first component that is "complementary" to a groove or tongue, respectively, in a second component is one that fits or interlocks with the groove or tongue in the second component similarly to, e.g., puzzle pieces. FIG. 13A shows a single turbine blade 1345, which has a platform 1339 having a first lateral end 1371 and a second lateral end 1372 opposite the first lateral end 1371. The first lateral end 1371 has placed into it a tongue 1373, and the second lateral end 1372 has placed into it a groove 1374. FIG. 13B shows adjacent turbine blades linked using a tongue and groove system, comprising tongues 1373 and grooves 1374, placed into adjacent platforms. Such tongue-groove systems prevent leakage within the turbine engine. In some aspects, the grooves may be seal slots adapted to contain seals to restrict cooling flow from the first turbine blade to a second turbine blade, or between blades, to the flowpath. Seal slots may be located on the blade platform, on the fore or aft skirt, on the pressure side of the turbine blade, or on the suction side of the turbine blade.

In an aspect, the present invention relates to the core-shell mold structures of the present invention incorporated or combined with features of other core-shell molds produced in a similar manner. The following patent applications include disclosure of these various aspects and their use:

U.S. patent application Ser. No. 15/377,728, titled "INTEGRATED CASTING CORE-SHELL STRUCTURE", and filed Dec. 13, 2016;

U.S. patent application Ser. No. 15/377,711, titled "INTEGRATED CASTING CORE-SHELL STRUCTURE WITH FLOATING TIP PLENUM", and filed Dec. 13, 2016;

U.S. patent application Ser. No. 15/377,796, titled "MULTI-PIECE INTEGRATED CORE-SHELL STRUCTURE FOR MAKING CAST COMPONENT", and filed Dec. 13, 2016;

U.S. patent application Ser. No. 15/377,746, titled "MULTI-PIECE INTEGRATED CORE-SHELL STRUCTURE WITH STANDOFF AND/OR BUMPER FOR MAKING CAST COMPONENT", and filed Dec. 13, 2016;

U.S. patent application Ser. No. 15/377,763, titled "INTEGRATED CASTING CORE SHELL STRUCTURE WITH PRINTED TUBES FOR MAKING CAST COMPONENT", and filed Dec. 13, 2016;

U.S. patent application Ser. No. 15/377,759, titled "INTEGRATED CASTING CORE-SHELL STRUCTURE AND FILTER FOR MAKING CAST COMPONENT", and filed Dec. 13, 2016;

U.S. patent application Ser. No. 15/377,787, titled "INTEGRATED CASTING CORE SHELL STRUCTURE FOR MAKING CAST COMPONENT WITH NON-LINEAR HOLES", and filed Dec. 13, 2016;

U.S. patent application Ser. No. 15/377,766, titled "INTEGRATED CASTING CORE SHELL STRUCTURE FOR MAKING CAST COMPONENT HAVING THIN ROOT COMPONENTS", and filed Dec. 13, 2016.

U.S. patent application Ser. No. 15/377,783, titled "INTEGRATED CASTING CORE-SHELL STRUCTURE FOR MAKING CAST COMPONENT WITH COOLING HOLES IN INACCESSIBLE LOCATIONS", and filed Dec. 13, 2016.

The disclosure of each of these application are incorporated herein in their entirety to the extent they disclose additional aspects of core-shell molds and methods of making that can be used in conjunction with the core-shell molds disclosed herein.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

The invention claimed is:

1. A method for fabricating a ceramic mold, comprising:
   (a) contacting a cured portion of a workpiece with a liquid ceramic photopolymer;
   (b) irradiating a portion of the liquid ceramic photopolymer adjacent to the cured portion through a window contacting the liquid ceramic photopolymer;
   (c) removing the workpiece from an uncured liquid ceramic photopolymer; and
   (d) repeating steps (a)-(c) until a ceramic mold is formed, the ceramic mold comprising:
      (1) a core portion and a shell portion, each formed from the liquid ceramic photopolymer, with at least one cavity between the core portion and the shell portion, the cavity adapted to define the shape of a cast component upon casting and removal of the ceramic mold, and
      (2) one or more inward protrusions formed from the liquid ceramic photopolymer and protruding inward from the shell into the at least one cavity, wherein each inward protrusion defines a groove in the cast component upon removal of the mold; and
      wherein the cast component is adapted to fit with a second cast component by linking the groove in the cast component with a complementary tongue in the second cast component.

2. The method of claim 1, wherein the method comprises, after step (d), a step (e) comprising pouring a liquid metal into the ceramic mold and solidifying the liquid metal to form the cast component.

3. The method of claim 2, wherein the method comprises, after step (e), a step (f) comprising removing the mold from the cast component.

4. The method of claim 3, wherein removing the mold from the cast component comprises a combination of mechanical force and chemical leaching.

5. The method of claim 1, the ceramic mold further comprising:
   (3) one or more outward grooves extending outward in the shell from the cavity, wherein each outward groove defines a tongue in the cast component upon removal of the mold, wherein each of the one or more outward grooves in the shell is positioned such that each of the one or more tongues in the cast component is opposite a respective one of the one or more grooves in the cast component upon removal of the mold.

6. A method of preparing cast components, comprising:
   fabricating a plurality of ceramic molds by the method of claim 5;
   pouring a liquid metal into the plurality of ceramic molds and solidifying the liquid metal to form a plurality of cast components, each having one or more tongues opposite one or more grooves;
   removing the molds from the cast components; and
   joining the cast components together by placing the tongues of the cast components into the grooves of adjacent cast components.

7. The method of claim 6, wherein the plurality of cast components is a plurality of single crystal metal turbine blades or stators each having a platform with a first lateral end and a second lateral end opposed to the first lateral end, wherein the one or more tongues are formed in the first lateral ends and the one or more grooves are formed in the second lateral ends.

\* \* \* \* \*